United States Patent
Matuno et al.

[11] Patent Number: 6,017,395
[45] Date of Patent: Jan. 25, 2000

[54] GAS PRESSURE REGULATION IN VAPOR DEPOSITION

[75] Inventors: Shunichi Matuno; Yoshiyuki Kakimoto, both of Tokyo, Japan

[73] Assignee: NEC Corporation, Tokyo, Japan

[21] Appl. No.: 08/816,329

[22] Filed: Mar. 13, 1997

[30] Foreign Application Priority Data

Mar. 13, 1996 [JP] Japan .................................. 8-056510

[51] Int. Cl.$^7$ .................................................. C23C 16/00
[52] U.S. Cl. ........................................ 118/715; 118/719
[58] Field of Search .................................. 118/715, 724, 118/725, 719; 117/201, 202; 427/255.1

[56] References Cited

U.S. PATENT DOCUMENTS

| | | | |
|---|---|---|---|
| 4,167,915 | 9/1979 | Toole et al. ............................ | 118/724 |
| 4,747,367 | 5/1988 | Posa ...................................... | 118/715 |
| 5,470,389 | 11/1995 | Ishihara et al. ...................... | 118/725 |
| 5,575,854 | 11/1996 | Jinnouchi et al. ..................... | 118/715 |
| 5,580,822 | 12/1996 | Hayakawa et al. ................... | 118/715 |
| 5,595,603 | 1/1997 | Klinedinst et al. ................... | 118/724 |
| 5,673,750 | 10/1997 | Tsubone et al. ...................... | 118/725 |

FOREIGN PATENT DOCUMENTS

| | | |
|---|---|---|
| 62-51209 | 3/1987 | Japan . |
| 1-220821 | 9/1989 | Japan . |
| 1-239839 | 9/1989 | Japan . |

Primary Examiner—Shrive Beck
Assistant Examiner—Bret Chen
Attorney, Agent, or Firm—Young & Thompson

[57] ABSTRACT

A vapor deposition apparatus includes a plurality of gas sources, a first gas feed line which is in fluid communication with the gas sources and through which a gas necessary for conducting vapor deposition is introduced into a reaction pipe, a second gas feed line which is in fluid communication with the gas sources and through which a gas unnecessary for conducting vapor deposition is exhausted, a detector for detecting a difference A in pressure between the first and second gas feed lines, the detector being disposed upstream of inlet ports at which gases are supplied to the first and second gas feed lines from the gas sources, a calculator for calculating and storing a difference B in pressure between the first and second gas feed lines to be measured at a location at which the detector is disposed, which difference B in pressure would cause the difference A in pressure measured at the inlet ports to be reduced to within an allowable range, and a pressure regulator disposed on one of the first and second gas feed lines for regulating a pressure in one of the first and second gas feed lines in accordance with the difference B in pressure. The vapor deposition apparatus makes it possible to eliminate the pressure difference between the first and second gas feed lines at the inlet ports, thereby preventing suction and discharge of source gases which would occur between the first and second gas feed lines, which are different in pressure, when supply of source gases is switched between the first and second gas feed lines.

12 Claims, 11 Drawing Sheets

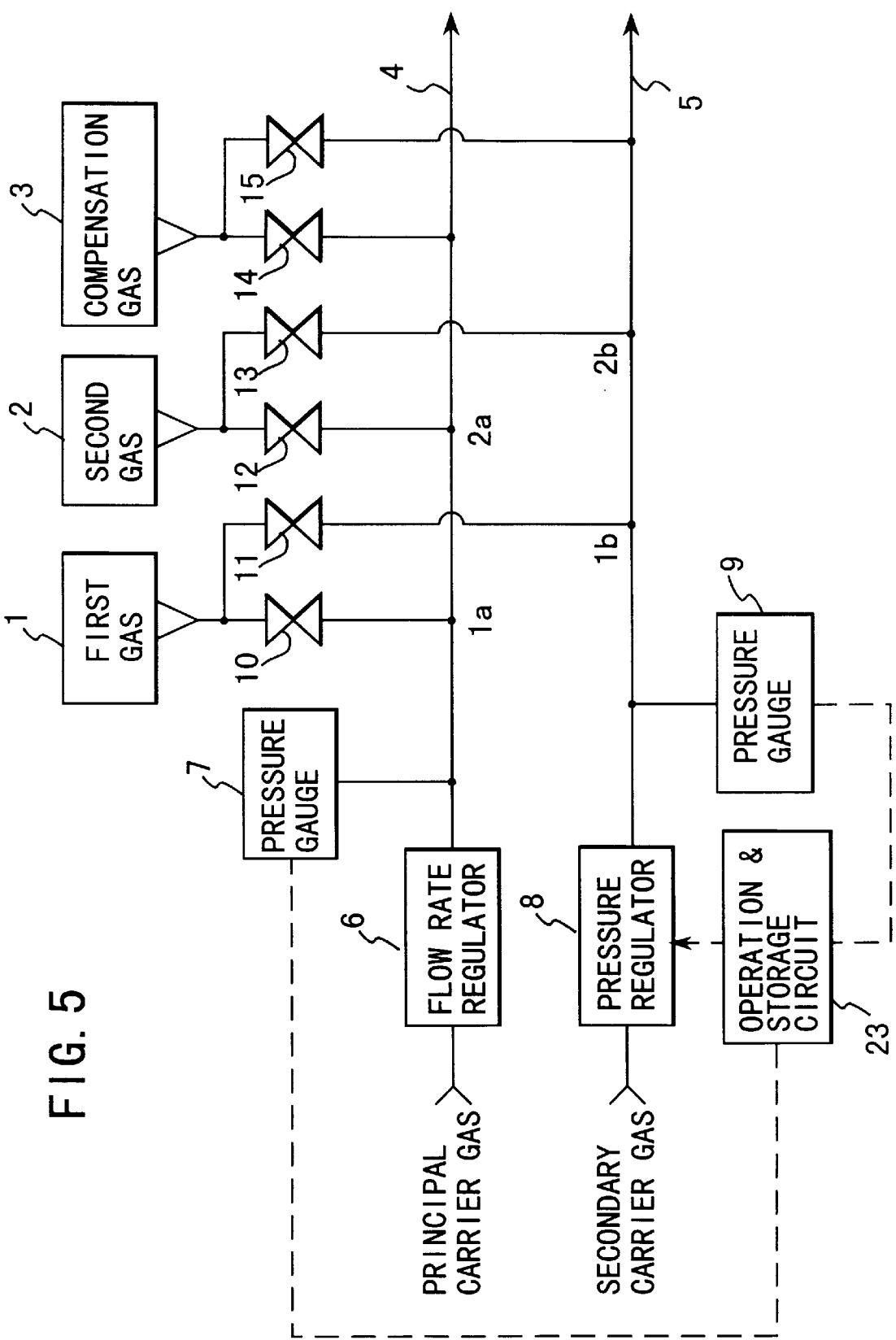

GAS PRESSURE REGULATION IN VAPOR DEPOSITION

BACKGROUND OF THE INVENTION

1. Field of the Invention

The invention relates to gas pressure regulation in vapor deposition, and more particularly to a vapor deposition apparatus and a method of regulating a gas pressure in gas feed lines in a vapor deposition apparatus, both suitable for the formation of a multilayer crystal or a highly purified crystal layer having a uniform, steep structural interface, on a semiconductor substrate.

2. Description of the Related Art

When a multilayer crystal film or a highly purified crystal layer is formed on a semiconductor substrate by means of a conventional vapor deposition apparatus, performances of a semiconductor device are significantly influenced by evenness of a crystal interface and/or abrupt changes in gases fed for the formation of a semiconductor device. Thus, various attempts have been made in order to enhance the evenness of a crystal interface and smooth the abrupt changes in gases. Hereinbelow will be explained one of conventional vapor deposition apparatuses.

FIG. 1 illustrates a pipe arrangement upstream of a reaction pipe in a conventional vapor deposition apparatus. As illustrated in FIG. 1, the vapor deposition apparatus includes a first gas source 1 for providing a first gas, a second gas source 2 for providing a second gas, a compensation gas source 3 for supplying a gas to compensate for flow rates in a later mentioned reaction pipe line 4 and a vent line 5, a reactive pipe line 4 in which a gas actually used for vapor deposition is mixed with a principal carrier gas and through which the mixture gas is introduced into a reaction pipe (not illustrated), and a vent line 5 through which a gas not used for vapor deposition is introduced into an exhauster (not illustrated) together with a secondary carrier gas. The first gas source 1 is in fluid communication with the reactive pipe line 4 and the vent line 5 at inlet ports 1a and 1b through valves 10 and 11, respectively. Similarly, the second gas source 2 is in fluid communication with the reactive pipe line 4 and vent line 5 at inlet ports 2a and 2b through valves 12 and 13, respectively, and the compensation gas source 3 is in fluid communication with the reactive pipe line 4 and vent line 5 through valves 14 and 15, respectively.

The illustrated vapor deposition apparatus also includes a flow rate regulator 6 and a pressure gauge 7 both disposed upstream of the inlet ports 1a and 2a in the reactive pipe line 4, and further includes a pressure regulator 8 and a pressure gauge 9 both disposed upstream of the inlet ports 1b and 2b in the vent line 5. The pressure gauges 7 and 9 and the pressure regulator 8 cooperate with each other to form an automatic pressure regulation system. The pressure gauge 9 detects a gas pressure in the vent line 5, and the thus detected gas pressure is fed back to the pressure regulator 8. Thus, the pressure regulator 8 controls a gas pressure in the vent line 5.

When vapor deposition is to be carried out for the formation of a multilayer crystal film, the valve 10 is opened and the valve 11 is closed to thereby cause the first gas used for first crystal growth to flow into the reactive pipe line 4, and the valve 12 is closed and the valve 13 is opened to thereby cause the second gas not used for first crystal growth to discharge into the vent line 5. When crystal structure is changed, in other words, when the second gas is to be introduced into the reactive pipe in place of the first gas, the first gas is exhausted into the vent line 5 and the second gas is introduced into the reactive pipe line 4.

In order to keep flow rates in the lines 4 and 5 constant when supply of the first and second gases is switched between the reactive pipe line 4 and vent line 5, the compensation gas is introduced into the reactive line 4 or vent line 5 in place of the first or second gas to thereby keep total flow rates in the lines 4 and 5 constant and thus minimize fluctuation in pressure in the lines 4 and 5. When supply of the first and second gases is switched between the lines 4 and 5, the automatic pressure regulation system comprising the pressure gauges 7 and 9 and the pressure regulator 8 reduces the pressure difference between the lines 4 and 5 down to zero or a predetermined value. This results in the ability to switch rapidly between the first and second gases and to control which gas is to be introduced into the reactive pipe.

Japanese Unexamined Patent Publication No. 1-239839 has suggested an apparatus for conducting metal organic vapor phase epitaxial growth, which is illustrated in FIG. 2. According to the Publication, the illustrated apparatus is characterized in that the pressure difference between a reactive pipe line 4 and a vent line 5 is reduced to zero, the dead space is attempted to be substantially eliminated, the length of the reactive pipe line 4 is attempted to be as short as possible, and a flow rate regulator 18 is disposed just downstream of switching valves 17 and is formed integrally with the switching valves 17, resulting in the ability to switch gas supply more rapidly and more accurately.

Japanese Unexamined Patent Publication No. 62-51209 has suggested a vapor deposition apparatus, as illustrated in FIG. 3, in which a reactive pipe line 20 and a vent line 21 are provided for each of first and second gases, resulting in that switch in gas supply can be carried out more rapidly.

However, the above mentioned conventional vapor deposition apparatuses have a problem in that a pressure difference is produced between the reactive pipe line and the vent line at inlet ports through which gases are introduced into the lines, because of a difference in a mixture ratio of gases and carrier gases in the lines, resulting in that it is merely possible to cause the above mentioned difference in pressure to be zero at only one inlet port, even if pressure control is conducted by means of an automatic pressure regulator.

FIGS. 4A and 4B illustrate relationship between a line position and a pressure in a line with respect to the reactive pipe line 4 and the vent line 5 illustrated in FIG. 1. At first, as illustrated in FIG. 4A, gas supply switch is conducted between the reactive pipe line 4 and the vent line 5 while the pressure regulator 8 controls a gas pressure in the lines 4 and 5 so that a pressure at the inlet port 1a is equal to a pressure at the inlet port 1b, that is, a difference in pressure between the reactive pipe line 4 and the vent line 5 is zero. However, as illustrated in FIG. 4B, since it is quite difficult to perfectly conform gas species flowing in the lines 4 and 5 to each other when the second gas is introduced into the reactive pipe line 4, there is produced a pressure gradient in the lines 4 and 5 due to a difference in gas species. The pressure gradient in turn makes it impossible to cause a pressure at the inlet port 2a to be equal to a pressure at the inlet port 2b, in other words, makes it impossible to obtain a difference in pressure between the lines 4 and 5 at the inlet ports 2a and 2b to be zero.

Due to the above mentioned reason, it is not possible to cause a difference in pressure between the lines 4 and 5 at the inlet ports to be zero when the gas supply is switched between the reactive pipe line 4 and the vent line 5. This is accompanied with the fact that it is not possible to prevent suction and discharge of the first and second gases between a high pressure line and a low pressure line when the gas supply is switched. For instance, provided that a pressure at the inlet port 1a through which the first gas is introduced into the reactive pipe line 4 is smaller than a pressure at the inlet port 2b through which the second gas is introduced into the vent line 5, the second gas to be discharged into the vent line 5 is sucked into the reactive pipe line 4 due to a pressure difference between the inlet ports 1a and 1b, resulting in uncontrollability of ingredients of a gas to be introduced into the reactive pipe. Thus, the conventional vapor deposition apparatuses have problems that switching ability between first and second gases, namely controllability in a mixture ratio may be deteriorated, and that steepness of an interface between crystal layers may be deteriorated.

SUMMARY OF THE INVENTION

In view of the foregoing problems of the conventional vapor deposition apparatuses, it is an object of the present invention to provide an apparatus and a method for vapor deposition, which are capable of enhancing gas switching ability and forming a film having improved uniformness and steepness in an interface between crystal films.

In one aspect, there is provided a vapor deposition apparatus including (a) a plurality of gas sources, (b) a first gas feed line which is in fluid communication with the gas sources and through which a gas necessary for conducting vapor deposition is introduced into a reaction pipe, (c) a second gas feed line which is in fluid communication with the gas sources and through which a gas unnecessary for conducting vapor deposition is exhausted, (d) a detector for detecting a difference A in pressure between the first and second gas feed lines, the detector being disposed upstream of inlet ports at which gases are supplied to the first and second gas feed lines from the gas sources, (e) a calculator for calculating and storing a difference B in pressure between the first and second gas feed lines measured at a location where the detector is disposed, which difference B in pressure between the first and second gas feed lines would cause the difference A in pressure measured at the inlet ports to be reduced to within an allowable range, and (f) a pressure regulator disposed on one of the first and second gas feed lines for regulating a pressure in one of the first and second gas feed lines in accordance with the difference B in pressure between the first and second gas feed lines.

The vapor deposition apparatus may further include a flow rate regulator disposed on one of the first and second gas feed lines, in which case the pressure regulator is disposed on the other of the first and second gas feed lines. The vapor deposition apparatus may still further include a compensation gas source in fluid communication with the first and second gas feed lines for supplying a gas to compensate for flow rates in the first and second gas feed lines.

The allowable range may be determined as a desired range required for the formation of crystal films. For instance, the allowable range is determined to be equal to zero.

The detector may be comprised of pressure gauges disposed on the first and second gas feed lines, or a differential pressure gauge disposed between the first and second gas feed lines. The pressure regulator is disposed either upstream or downstream of the inlet ports.

In another aspect, there is provided a method of regulating a gas pressure in gas feed lines in a vapor deposition apparatus, including the steps of (a) measuring a gas pressure in first and second gas feed lines, (b) calculating a difference B in pressure between the first and second gas feed lines to be measured at a location at which the gas pressure in the first and second gas feed lines was measured, based on a gas pressure measured in the step (a), the difference B in pressure being defined as a difference in pressure by which a difference A in pressure between the first and second gas feed lines to be measured at an inlet port at which one of gases is supplied to the first and second gas feed lines would be caused to be reduced down to an allowable range, and (c) producing the difference B in pressure within the first or second gas feed line at a location at which the gas pressure in the first and second gas feed lines was measured, when gases to be introduced into the first and second gas feed lines are to be switched.

There is further provided a method of regulating a gas pressure in gas feed lines in a vapor deposition apparatus, including the steps of (a) measuring a gas pressure in first and second gas feed lines, (b) calculating a difference A in pressure between the first and second gas feed lines, (c) calculating a difference B in pressure between the first and second gas feed lines to be measured at a location at which the gas pressure in the first and second gas feed lines was measured, based on the gas pressure measured in the step (a), the difference B in pressure being defined as a difference in pressure by which the difference A in pressure to be measured at an inlet port at which the second gas is supplied to the first and second gas feed lines would be caused to be reduced down into an allowable range, (d) regulating a gas pressure in the second gas feed line so that the difference A in pressure is reduced down to within an allowable range at the inlet port, when supply of the first gas is switched to the second gas feed line from the first gas feel line, and (e) producing the difference B in pressure within the second gas feed line at a location at which the gas pressure in the second gas feed line was measured, when supply of the second gas is switched to the first gas feed line from the second gas feed line.

In the step (a), the gas pressure in first and second gas feed lines may be measured either upstream or downstream of the inlet ports.

In accordance with the above mentioned present invention, it is possible to reduce the pressure difference between the first and second gas feed lines down to a desired value such as zero at the inlet ports, thereby preventing suction and discharge of first and second gases which would occur between the first and second gas feed lines which are different in pressure, when the supply of gases is switched between the first and second gas feed lines. Hence, it is now possible to control a mixture ratio of gases and thus form a multilayer crystal film and a highly purified crystal layer having a steep crystal layer interface.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 5 is a schematic view illustrating a pipe arrangement in a vapor deposition apparatus made in accordance with the first embodiment of the present invention.

DESCRIPTION OF THE PREFERRED EMBODIMENTS

Figure 6A:
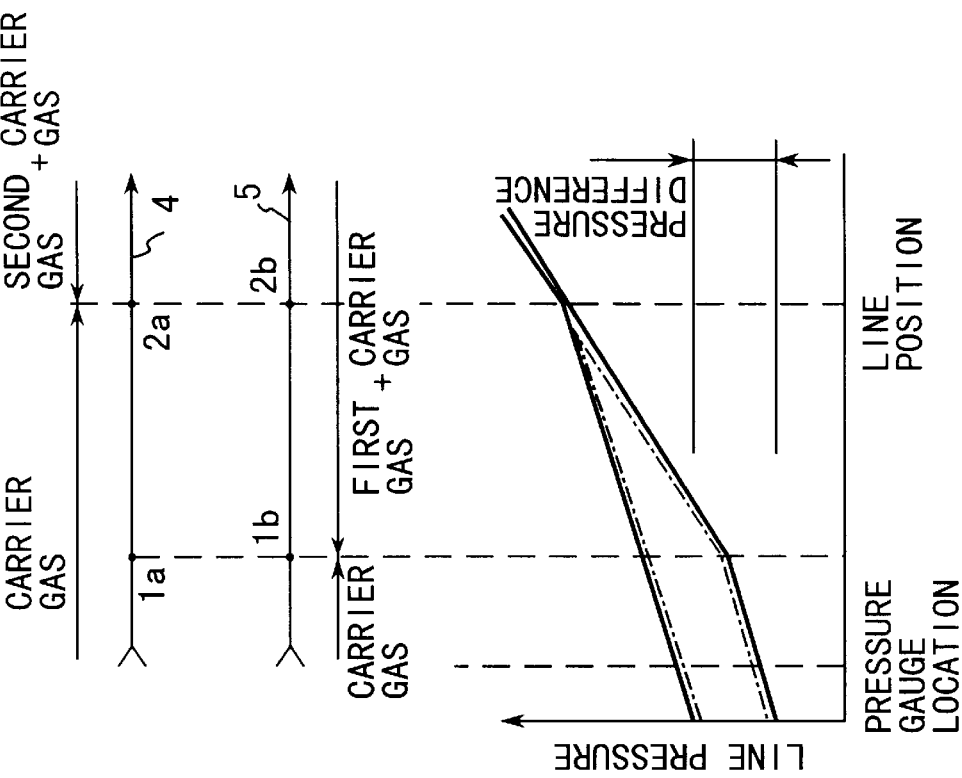
FIGS. 6A and 6B illustrate relationship between a position and a pressure in lines in a pipe arrangement illustrated in FIG. 5.
Figure 6B:
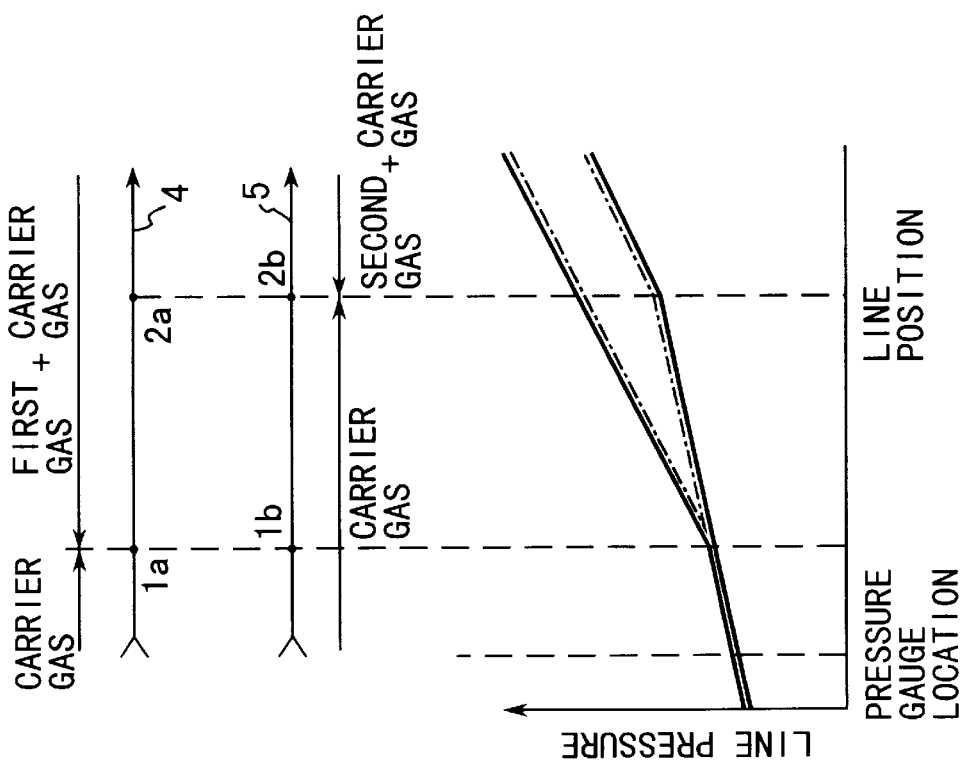

A vapor deposition apparatus made in accordance with the first embodiment is described hereinbelow with reference to FIGS. 5, 6A and 6B. In FIG. 5, parts or elements corresponding to those in FIG. 1 have been provided with the same reference numerals.

As illustrated in FIG. 5, the vapor deposition apparatus includes a first gas source 1 for providing a first gas, a second gas source 2 for providing a second gas, a compensation gas source 3 for supplying a gas to compensate for flow rates in a later mentioned reaction pipe line 4 and a vent line 5, a reactive pipe line 4 in which a gas actually used for vapor deposition is mixed with a principal carrier gas and through which the mixture gas is introduced into a reaction pipe (not illustrated), and a vent line 5 through which a gas not used for vapor deposition is introduced into an exhauster (not illustrated) together with a secondary carrier gas. The first gas source 1 is in fluid communication with the reactive pipe line 4 and the vent line 5 at inlet ports 1a and 1b through valves 10 and 11, respectively. Similarly, the second gas source 2 is in fluid communication with the reactive pipe line 4 and vent line 5 at inlet ports 2a and 2b through valves 12 and 13, respectively, and the compensation gas source 3 is in fluid communication with the reactive pipe line 4 and vent line 5 through valves 14 and 15, respectively.

The vapor deposition apparatus also includes a flow rate regulator 6 and a pressure gauge 7 both disposed upstream of the inlet ports 1a and 2a in the reactive pipe line 4, and further includes a pressure regulator 8 and a pressure gauge 9 both disposed upstream of the inlet ports 1b and 2b in the vent line 5. The pressure gauge 7 detects a pressure in the reactive pipe line 4, and the pressure gauge 9 detects a pressure in the vent line 5. The pressure gauges 7 and 9 transmit signals representing a pressure in the lines 4 and 5 to an operation and storage circuit 23. The operation and storage circuit 23 carries out an operation based on the received signals, as mentioned later, and transmits output signals to the pressure regulator 8. The pressure regulator 8 regulates a pressure in the vent line 5 in accordance with the output signals transmitted from the operation and storage circuit 23. The pressure gauges 7 and 9, the pressure regulator 8 and the operation and storage circuit 23 cooperate with each other to form an automatic pressure regulation system.

When vapor deposition is to be carried out for the formation of a multilayer crystal film, the valve 10 is opened and the valve 11 is made closed to thereby cause the first gas used for first crystal growth to flow into the reactive pipe line 4, and the valve 12 is closed and the valve 13 is opened to thereby cause the second gas not used for first crystal growth to discharge into the vent line 5.

When crystal structure is to be changed, in other words, when the second gas is to be introduced into the reactive pipe in place of the first gas, the valve 10 is closed and the valve 11 is open to thereby exhaust the first gas into the vent line 5, and the valve 12 is open and the valve 13 is closed to thereby introduce the second gas into the reactive pipe line 4.

When the gas supply switch between the first and second gases is carried out, the pressure gauges 7 and 9 detect a pressure in the lines 4 and 5, respectively, and transmit signals representing the detected pressure to the operation and storage circuit 23. The circuit 23 calculate a difference A in pressure between the reactive pipe line 4 and the vent line 5, and transmits an output signal representing the calculated difference in pressure to the pressure regulator 8. On receipt of the output signal from the circuit 23, the pressure regulator 8 controls a pressure in the vent line 5 so that the difference in pressure is eliminated at the inlet ports 1a and 1b, as illustrated in FIG. 6A.

Then, the valve 12 is opened and the valve 13 is closed to thereby introduce the second gas into the reactive pipe line 4. As illustrated in FIG. 6B, the operation and storage circuit 23 in advance calculates and stores a difference B in pressure to be measured at a location where the pressure gauge 9 is disposed, based on pressure gradient in the vent line 5. Herein, the difference B in pressure is defined as a difference in pressure by which a difference A in pressure between the lines 4 and 5 to be measured at the inlet ports 2a and 2b would be eliminated. The circuit 23 transmits an output signal representing the difference B in pressure to the pressure regulator 8.

Receiving the output signal from the circuit 23, the pressure regulator 8 controls a pressure in the vent line 5 so that a pressure corresponding to the difference B in pressure is produced at a location where the pressure gauge 9 is disposed. As a result, the above mentioned difference A in pressure can be eliminated.

Thus, it is possible to switch the supply of the first and second gases between the reactive pipe line 4 and the vent line 5 without suction and discharge of the gases at the inlet ports 1a, 1b, 2a and 2b. Hence, in accordance with the first embodiment, it is possible to form a film having improved evenness and steepness of a crystal interface.

Figure 7:
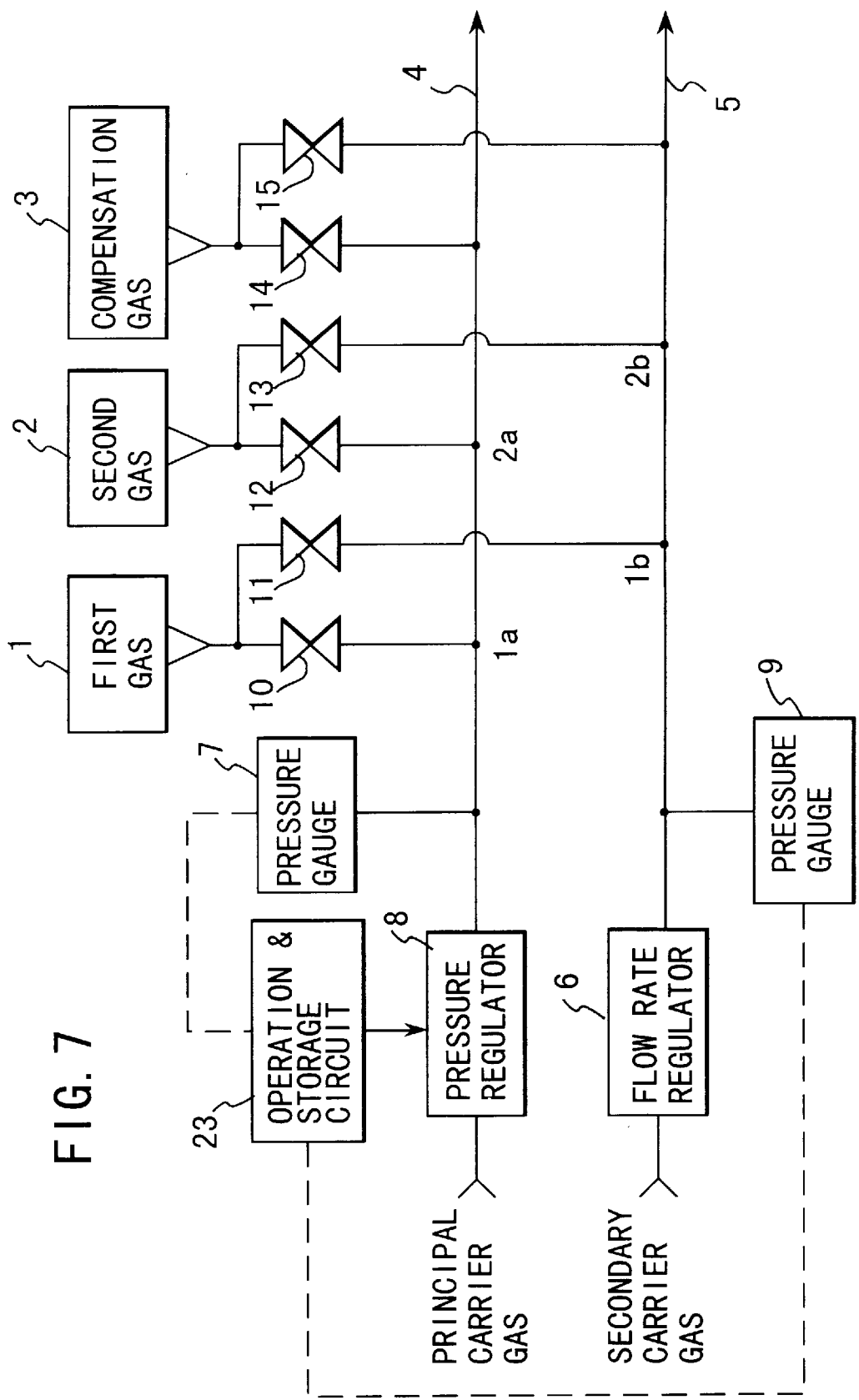
FIG. 7 is a schematic view illustrating a pipe arrangement in a vapor deposition apparatus made in accordance with the second embodiment of the present invention.

FIG. 7 illustrates a vapor deposition apparatus made in accordance with the second embodiment of the present invention. As illustrated in FIG. 7, the pressure regulator 8 may be disposed on the reactive pipe line 4 unlike the first embodiment in which the pressure regulator 8 is disposed on the vent line 5. The illustrated vapor deposition apparatus has the same structure as that of the apparatus illustrated in FIG. 5 except as to where the pressure regulator 8 is disposed. In the illustrated vapor deposition apparatus, the pressure regulator 8 controls a pressure in the reactive pipe line 4 so that a difference in pressure between the lines 4 and 5 is eliminated at the inlet ports 1a and 1b or at the inlet ports 2a and 2b.

Figure 8:
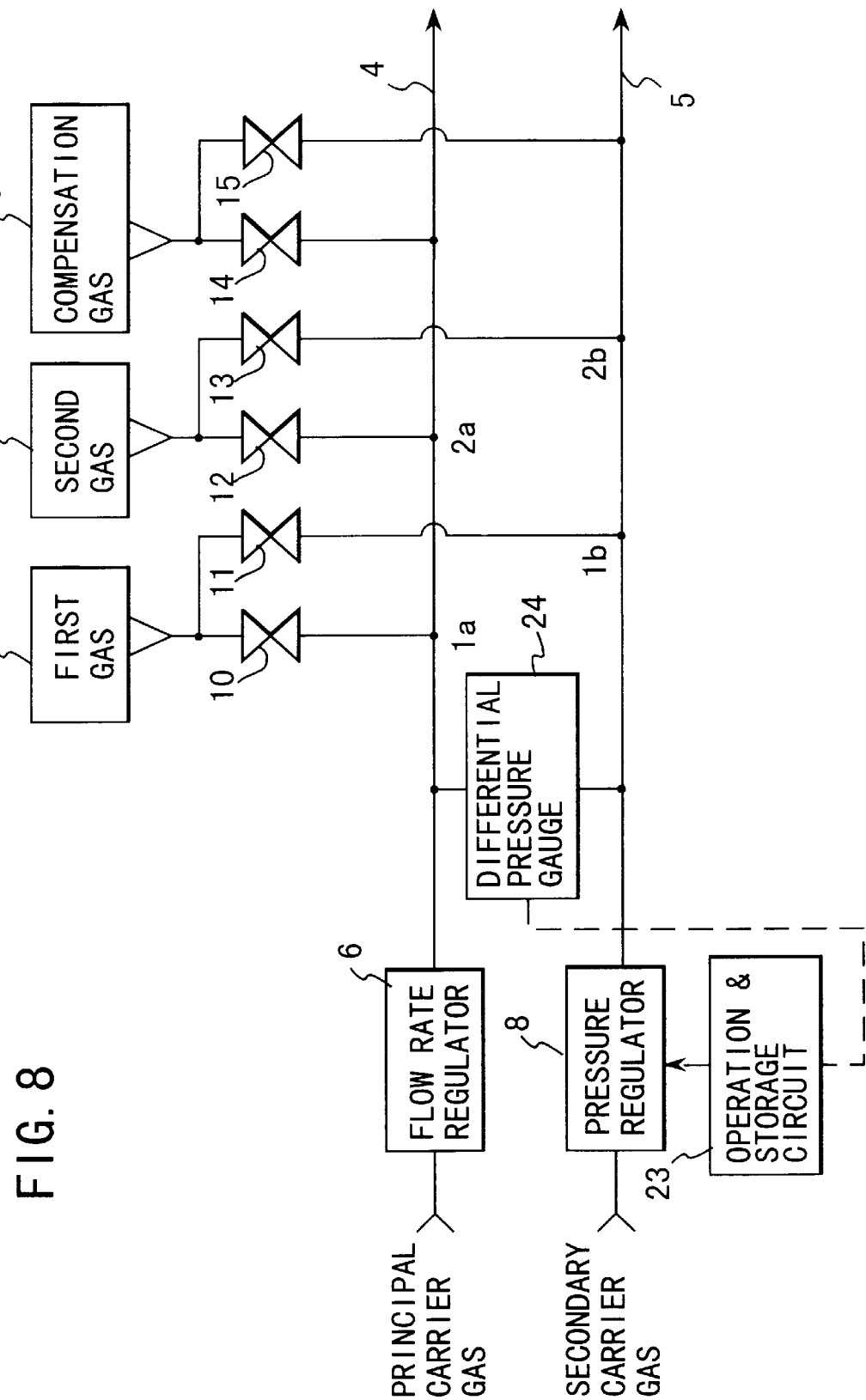
FIG. 8 is a schematic view illustrating a pipe arrangement in a vapor deposition apparatus made in accordance with the third embodiment of the present invention.

FIG. 8 illustrates a vapor deposition apparatus made in accordance with the third embodiment of the present invention. As illustrated in FIG. 8, there may be disposed a differential pressure gauge 24 between the reactive pipe line 4 and the vent line 5 in place of the two pressure gauges 7 and 9 as used in the first embodiment in order to detect a difference in pressure between the lines 4 and 5. A difference in pressure between the lines 4 and 5 detected by the differential pressure gauge 24 is fed back to the pressure regulator 8 to control a pressure in the vent line 5.

Figure 9:
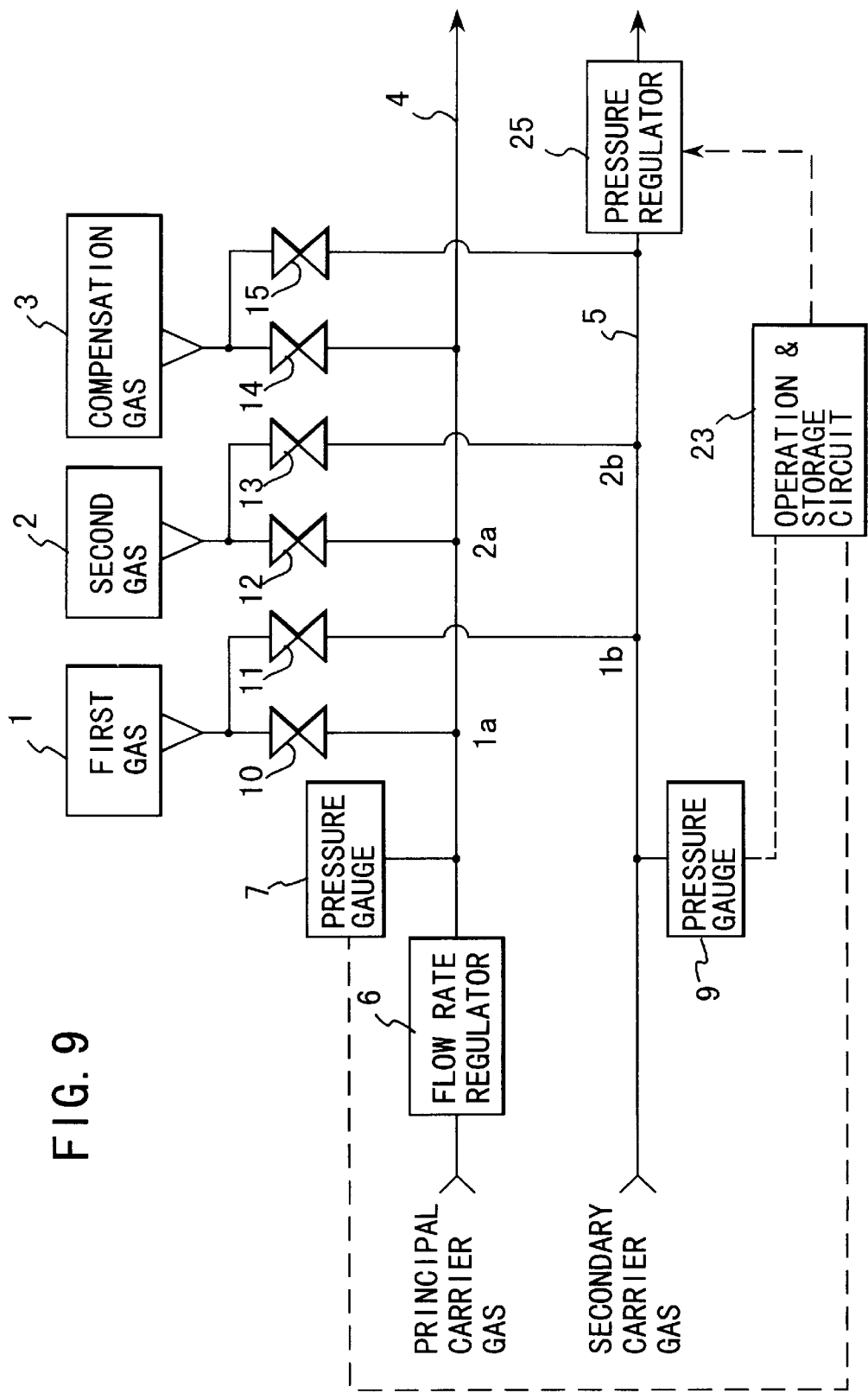
FIG. 9 is a schematic view illustrating a pipe arrangement in a vapor deposition apparatus made in accordance with the fourth embodiment of the present invention.

FIG. 9 illustrates a vapor deposition apparatus made in accordance with the fourth embodiment of the present invention. The fourth embodiment is different from the first embodiment only in that a pressure regulator 25 is disposed downstream of the inlet port 2b on the vent line 5. In the fourth embodiment, the operation and storage circuit 23 receives from the pressure gauge 9 a signal representing a pressure in the vent line 5, and calculates the difference B in pressure, which is defined, as mentioned earlier, as a difference in pressure by which a difference A in pressure between the lines 4 and 5 to be measured at the inlet ports 1a and 1b or 2a and 2b would be eliminated. The pressure regulator 25 receives from the circuit 23 an output signal representing the difference B in pressure, and controls a pressure in the vent line 5 accordingly.

Figure 10:
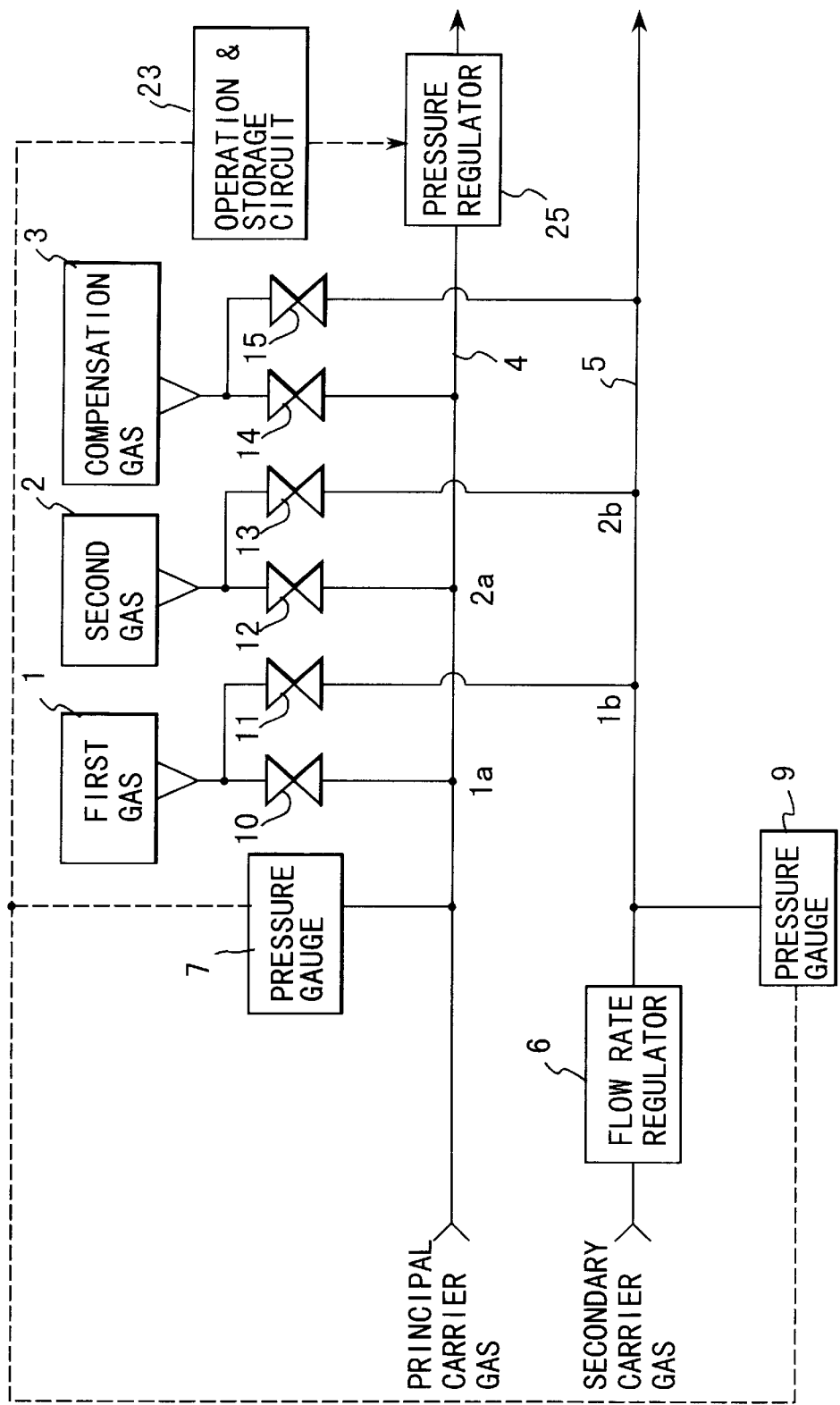
FIG. 10 is a schematic view illustrating a pipe arrangement in a vapor deposition apparatus made in accordance with the fifth embodiment of the present invention.

FIG. 10 illustrates a vapor deposition apparatus made in accordance with the fifth embodiment of the present invention. The fifth embodiment is different from the first embodiment only in that a pressure regulator 25 is disposed downstream of the inlet port 2a on the reactive pipe line 4. In the fifth embodiment, the operation and storage circuit 23 receives from the pressure gauge 7 a signal representing a pressure in the reactive pipe line 4, and calculates the above defined difference B in pressure. The pressure regulator 25 receives from the circuit 23 an output signal representing the difference B in pressure, and controls a pressure in the vent line 4 accordingly.

Figure 11:
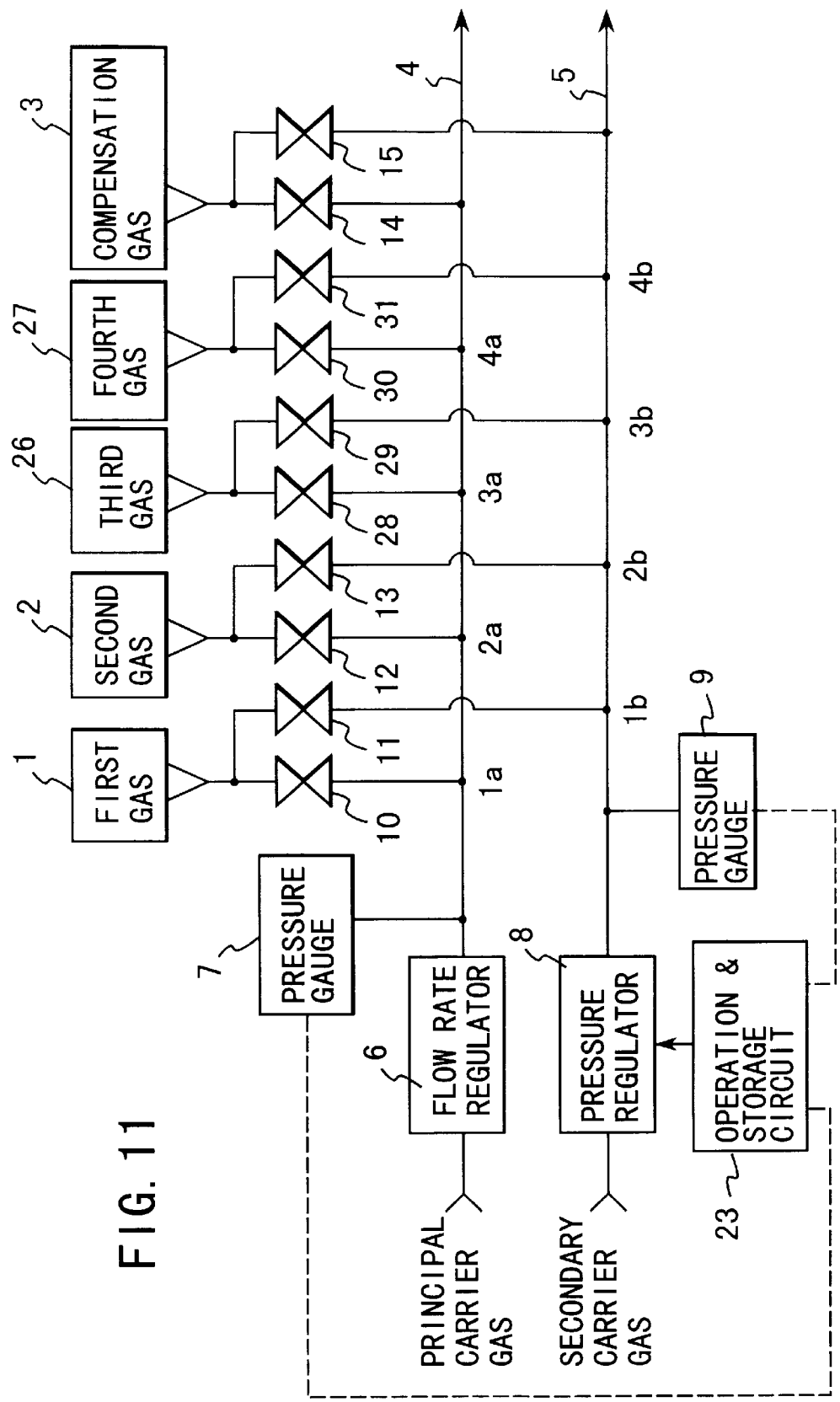
FIG. 11 is a schematic view illustrating a pipe arrangement in a vapor deposition apparatus made in accordance with the sixth embodiment of the present invention.

FIG. 11 illustrates a vapor deposition apparatus made in accordance with the sixth embodiment of the present invention. The illustrated vapor deposition apparatus includes a third gas source 26 for providing a third gas and a gas a fourth gas source 27 for providing a fourth gas as well as the first and second gas sources 1 and 2. The third gas source 26 is in fluid communication with the reactive pipe line 4 and the vent line 5 at inlet ports 3a and 3b through valves 28 and 29, respectively. Similarly, the fourth gas source 27 is in fluid communication with the reactive pipe line 4 and vent line 5 at inlet ports 4a and 4b through valves 30 and 31, respectively. Similarly to the first to fifth embodiments, the operation and storage circuit 23 receives a difference A in pressure between the lines 4 and 5 to be measured at the inlet ports 1a and 1b, 2a and 2b, 3a and 3b, and 4a and 4b, and in advance calculates and stores a difference B in pressure by which the difference A in pressure can be eliminated. On receipt of an output signal representing the difference B in pressure from the circuit 23, the pressure regulator 8 produces a pressure corresponding to the difference B in pressure at a location where the pressure gauge 9 is disposed.

Thus, it is possible to switch the supply of the first to fourth gases between the reactive pipe line 4 and the vent line 5 without suction and discharge of the gases which would occur at the inlet ports 1a to 4a and 1b to 4b.

In the above mentioned first to sixth embodiments, the operation and storage circuit 23 calculates and stores a difference B in pressure between the lines 4 and 5, defined as a difference in pressure by which a difference A in pressure between the lines 4 and 5 to be measured at the inlet ports (for instance, 1a and 1b) would be eliminated, namely would be reduced down to zero. However, it should be noted that the operation and storage circuit 23 may be set to calculate and store a difference B in pressure by which the above mentioned difference A in pressure would be reduced not to zero, but to a predetermined value within an allowable range.

Figure 1:
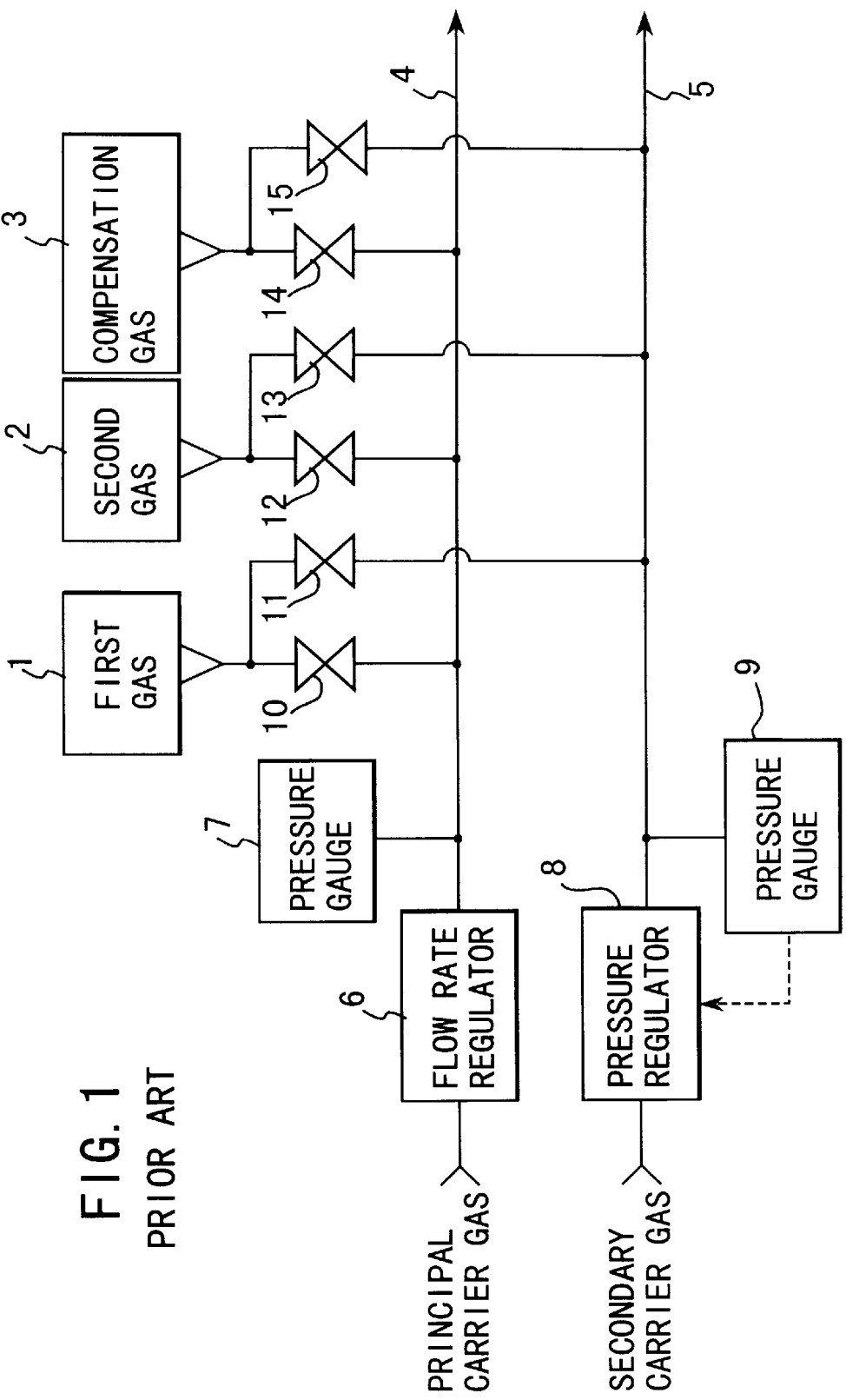
FIG. 1 is a schematic view illustrating a pipe arrangement in a prior vapor deposition apparatus.
Figure 2:
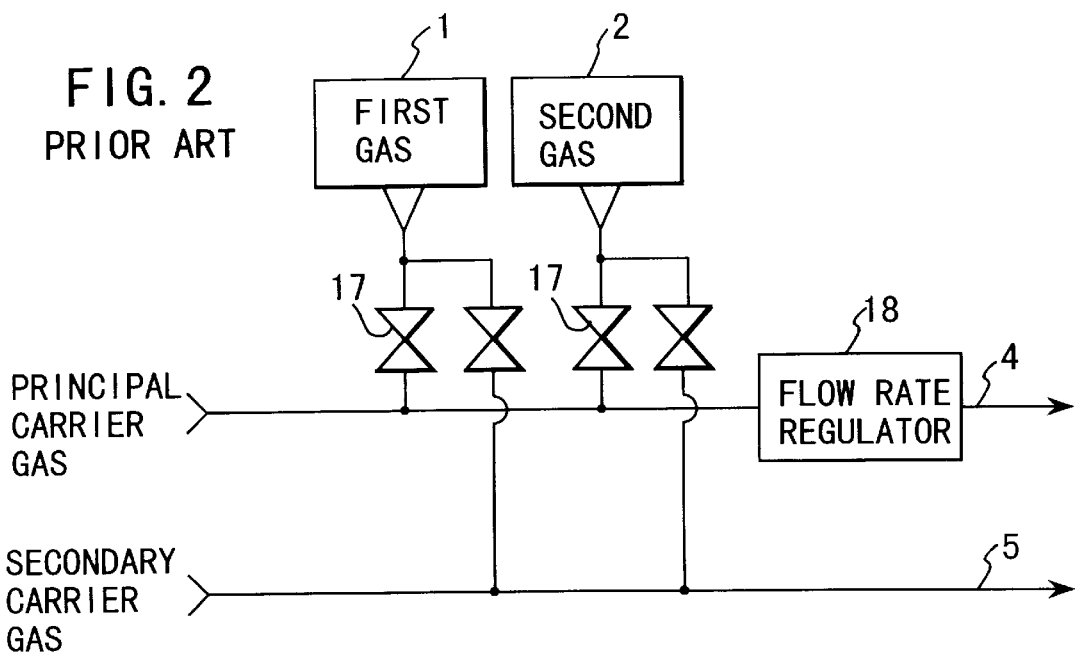
FIG. 2 is a schematic view illustrating a pipe arrangement in another prior vapor deposition apparatus.
Figure 3:
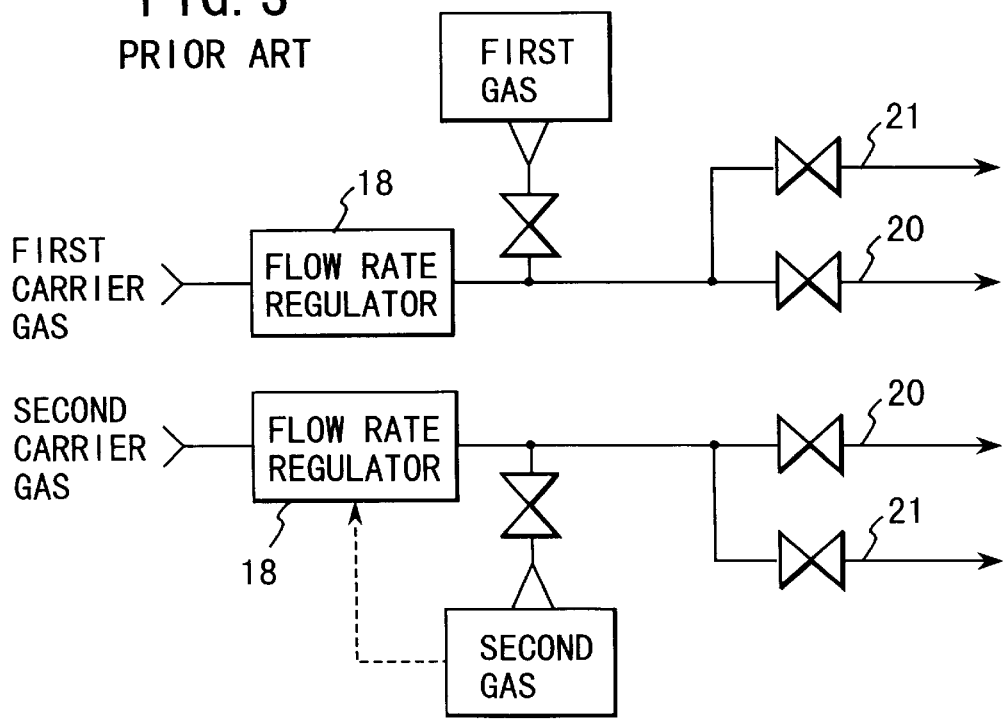
FIG. 3 is a schematic view illustrating a pipe arrangement in still another prior vapor deposition apparatus.
Figure 4A:
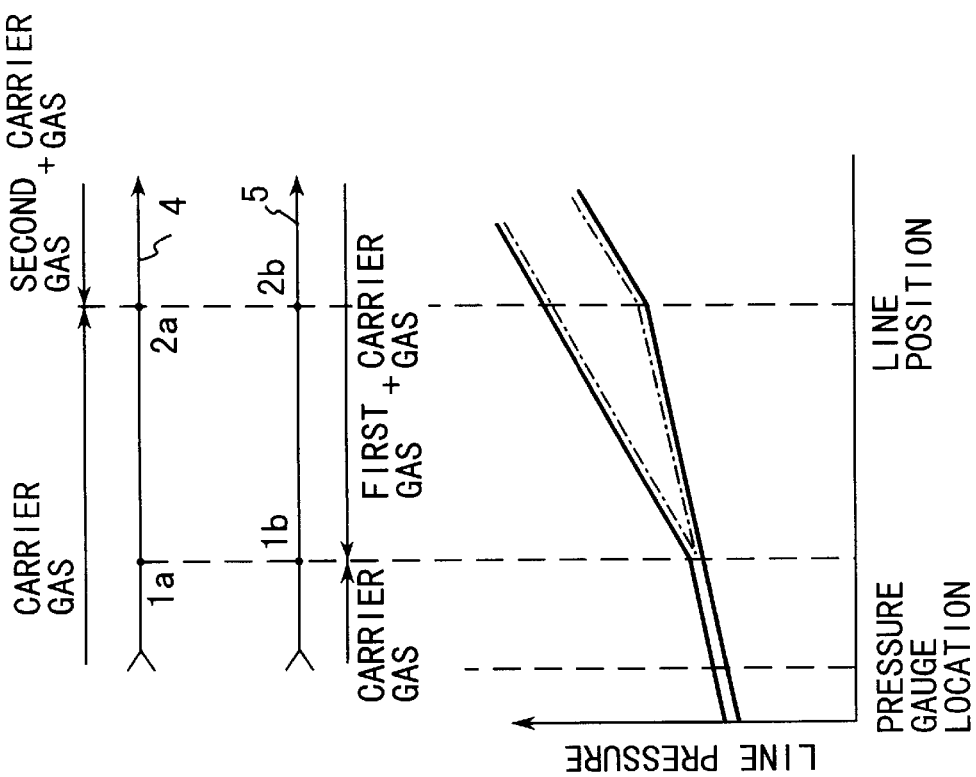
FIGS. 4A and 4B illustrate relationship between a position and a pressure in lines in a pipe arrangement illustrated in FIG. 1.
Figure 4B:
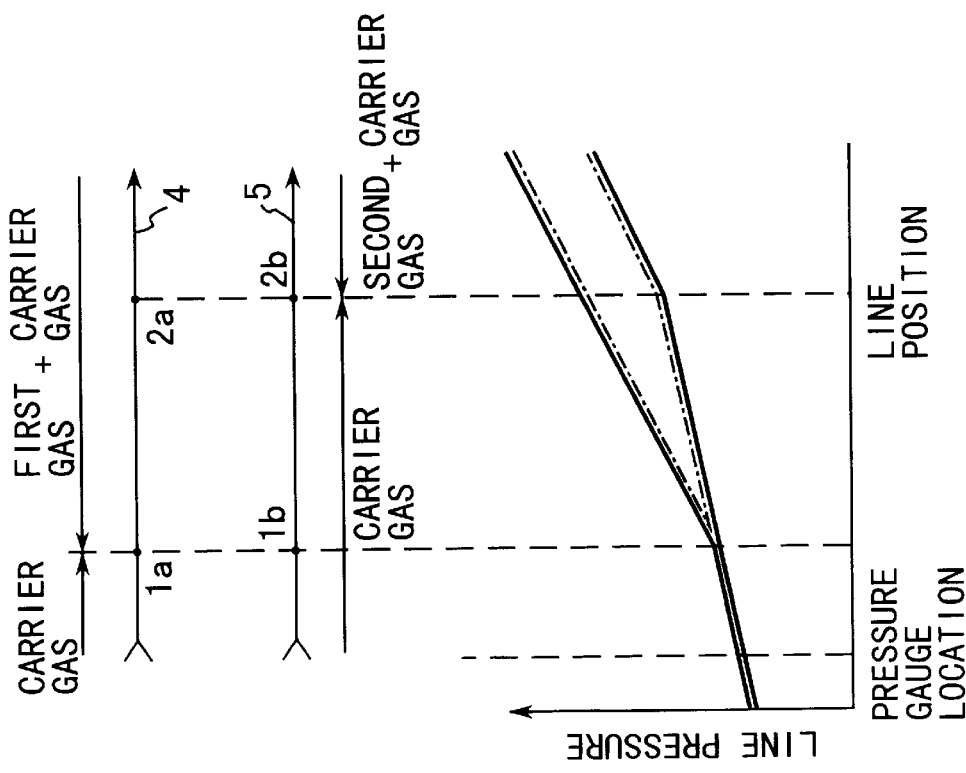
Figure 12:
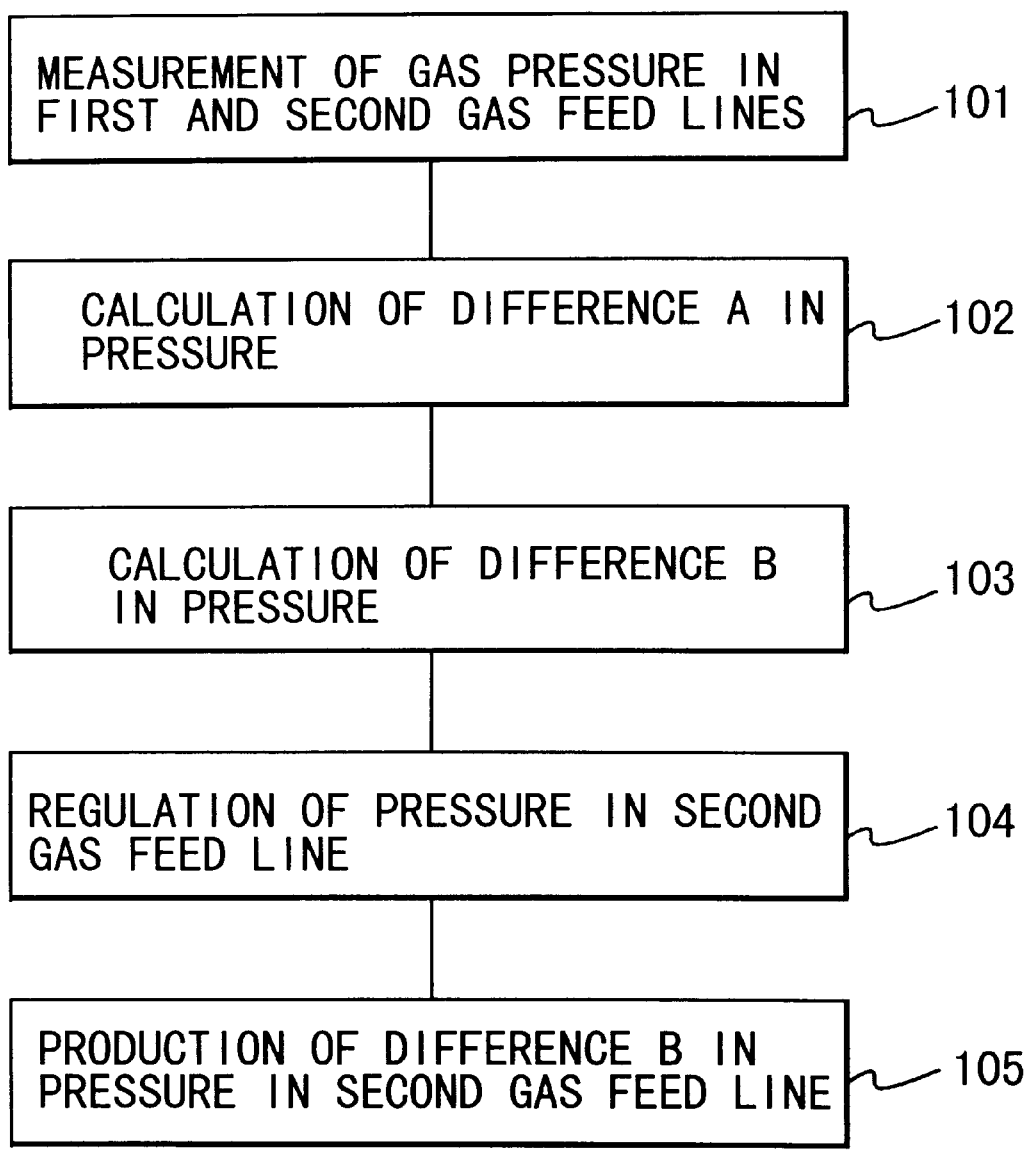
FIG. 12 is a flow chart showing respective steps for carrying out a method in accordance with the present invention.

FIG. 12 is a flow chart showing the steps for carrying out a method in accordance with the present invention. Referring to FIG. 1, first, a gas pressure in the reactive line 4 and the vent line 5 is measured by means of the pressure gauges 7 and 9 in step 101. Signals representing the measured pressure are transmitted to the operation and storage circuit 23 from the pressure gauges 7 and 9.

Based on the signals transmitted from the pressure gauges 7 and 9, the circuit 23 calculates a difference A in pressure between the lines 4 and 5, and stores the thus calculated value in step 102.

In step 103, the circuit 23 further calculates a difference B in pressure between the lines 4 and 5 to be measured at a location at which the pressure gauge 9 is disposed, based on the gas pressure in the vent line 5 measured by the pressure gauge 9 in the step 101. Herein, the difference B in pressure is defined as a difference in pressure by which a difference A in pressure between the lines 4 and 5 to be measured at the inlet ports 1a and 1b or 2a and 2b would be eliminated.

Then, in step 104, the pressure regulator 8 regulates a gas pressure in the vent line 5 so that the difference A in pressure is eliminated at the inlet ports 1a and 1b, when the first gas is stopped from being introduced into the reactive pipe line 4 and starts being introduced into the vent line 5.

Then, when the second gas is stopped from being introduced into the vent line 5 and starts being introduced into the reactive pipe line 4, the pressure regulator 8 receives an output signal representing the difference B in pressure from the circuit 2, and produces a pressure corresponding to the difference B in pressure in the line 5 at a location at which the pressure gauge 9 is disposed, as indicated in step 105.

In accordance with the above mentioned method, it is possible to switch the supply of the first and second gases between the reactive pipe line 4 and the vent line 5 without suction and discharge of the gases which would occur at the inlet ports 1a, 1b, 2a and 2b with the result of capability of formation of a film having improved evenness and steepness of a crystal interface.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-56510 filed on Mar. 13, 1996 including specification, claims, drawings and summary is incorporated herein by reference in its entirety.

What is claimed is:

1. A vapor deposition apparatus comprising:

(a) a plurality of gas sources;

(b) a first gas feed line which is in fluid communication with said gas sources and through which a principal carrier gas necessary for conducting vapor deposition is introduced into a reaction pipe;

(c) a second gas feed line which is in fluid communication with said gas sources and through which a secondary carrier gas unnecessary for conducting vapor deposition is exhausted;

(d) detector means for detecting a difference A in pressure between said first and second gas feed lines, said detector means being disposed upstream of inlet ports at which gases are supplied to said first and second gas feed lines from said gas sources;

(e) means for calculating and storing a difference B in pressure between said first and second gas feed lines measured at a location where said detector means is disposed, which difference B in pressure between said first and second gas feed lines would cause said difference A in pressure measured at said inlet ports to be reduced to a desirable range; and (f) a pressure regulator disposed on one of said first and second gas feed lines for regulating a pressure in one of said first and second gas feed lines in accordance with said calculated and stored difference B in pressure between said first and second gas feed lines, thereby preventing suction and discharge of source gases between the first and second gas feed lines, when supply of source gases is switched between the first and second gas lines.

2. The vapor deposition apparatus as set forth in claim 1, wherein said desirable range is equal to zero.

3. The vapor deposition apparatus as set forth in claim 1, wherein said detector means is comprised of pressure gauges disposed on said first and second gas feed lines.

4. The vapor deposition apparatus as set forth in claim 1, wherein said detector means is comprised of a differential pressure gauge disposed between said first and second gas feed lines.

5. The vapor deposition apparatus as set forth in claim 1 further comprising a flow rate regulator disposed on one of said first and second gas feed lines, said pressure regulator being disposed on the other of said first and second gas feed lines.

6. The vapor deposition apparatus as set forth in claim 1 further comprising a compensation gas source in fluid communication with said first and second gas feed lines for supplying a gas to compensate for flow rates in said first and second gas feed lines.

7. The vapor deposition apparatus as set forth in claim 1, wherein said pressure regulator is disposed upstream of said inlet ports.

8. The vapor deposition apparatus as set forth in claim 7, wherein said detector means is comprised of pressure gauges disposed on said first and second gas feed lines.

9. The vapor deposition apparatus as set forth in claim 7, wherein said detector means is comprised of a differential pressure gauge disposed between said first and second gas feed lines.

10. The vapor deposition apparatus as set forth in claim 1, wherein said pressure regulator is disposed downstream of said inlet ports.

11. The vapor deposition apparatus as set forth in claim 10, wherein said detector means is comprised of pressure gauges disposed on said first and second gas feed lines.

12. The vapor deposition apparatus as set forth in claim 10, wherein said detector means is comprised of a differential pressure gauge disposed between said first and second gas feed lines.

* * * * *